(12) United States Patent
Endo

(10) Patent No.: US 6,429,518 B1
(45) Date of Patent: Aug. 6, 2002

(54) SEMICONDUCTOR DEVICE HAVING A FLUORINE-ADDED CARBON FILM AS AN INTER-LAYER INSULATING FILM

(75) Inventor: Shunichi Endo, Tokyo-To (JP)

(73) Assignee: Tokyo Electron Ltd., Tokyo (JP)

( * ) Notice: Subject to any disclaimer, the term of this patent is extended or adjusted under 35 U.S.C. 154(b) by 0 days.

(21) Appl. No.: 09/659,342

(22) Filed: Sep. 12, 2000

Related U.S. Application Data

(63) Continuation of application No. PCT/JP99/05464, filed on Oct. 5, 1999.

(30) Foreign Application Priority Data

Oct. 5, 1998 (JP) .............................................. 10-297614

(51) Int. Cl.[7] .............................................. H01L 23/48
(52) U.S. Cl. ........................ 257/753; 257/765; 438/118; 438/628; 438/644; 438/654
(58) Field of Search ................................. 257/753, 765; 438/118, 628, 644, 654

(56) References Cited

U.S. PATENT DOCUMENTS

| | | | | |
|---|---|---|---|---|
| 5,506,443 A | * | 4/1996 | Furumura et al. | 257/635 |
| 6,005,291 A | * | 12/1999 | Koyanagi et al. | 257/751 |
| 6,033,979 A | * | 3/2000 | Endo | 438/622 |
| 6,046,502 A | * | 4/2000 | Matsuno | 257/751 |
| 6,157,083 A | * | 12/2000 | Usami et al. | 257/760 |
| 6,218,299 B1 | * | 4/2001 | Akahori et al. | 438/682 |

FOREIGN PATENT DOCUMENTS

| | | | |
|---|---|---|---|
| JP | 08083842 | * | 3/1996 |
| JP | 10223625 | * | 8/1998 |
| JP | 11-67907 | | 3/1999 |

* cited by examiner

*Primary Examiner*—Eddie Lee
*Assistant Examiner*—Eugene Lee
(74) *Attorney, Agent, or Firm*—Finnegan, Henderson, Farabow, Garrett & Dunner LLP

(57) ABSTRACT

In a semiconductor device, a contact layer is provided between a silicon-containing insulating film $SiO_2$, etc. or a metal wiring layer, and a fluorine-containing carbon CF film to increase their adhesion. For this purpose, SiC film deposition gases, such as $SiH_4$ gas and $C_2H_4$ gas, are excited into plasma to stack a SiC film [200] as the contact layer on the top surface of a $SiO_2$ film [110]. After that, switching of deposition gases is conducted for about 1 second by introducing $SiH_4$ gas, $C_2H_4$ gas, $C_4F_8$ gas and $C_2H_4$ gas. Subsequently, CF film deposition gases, such as $C_4F_8$ gas and $C_2H_4$ gas, for example, are excited into plasma to deposit[e] a CF film [120] on the SiC film [200]. In this way, both the SiC film deposition gases and the CF film deposition gases exist simultaneously during the deposition gas switching step, whereby Si—C bonds are produced near the boundary between the SiC film [200] and the CF film [120] across these films, and they enhance adhesion between these films and hence increase adhesion of the $SiO_2$ film [110] and the CF film [120].

8 Claims, 9 Drawing Sheets

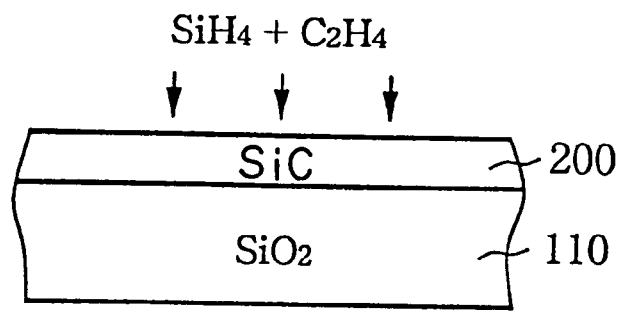
F I G. 2 A
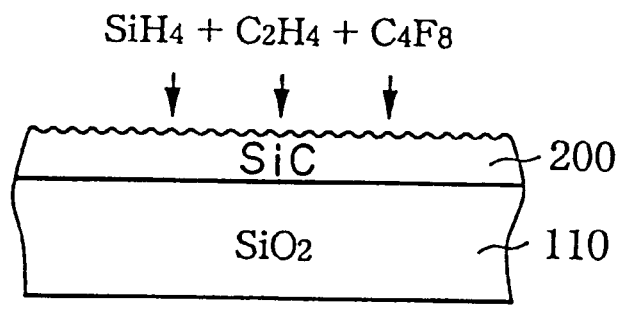
F I G. 2 B
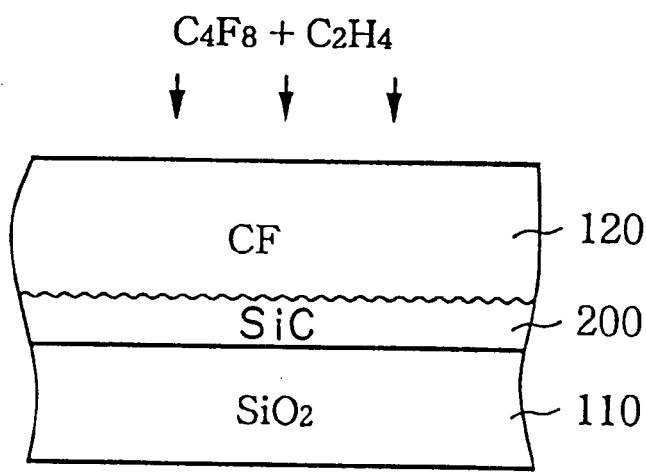
F I G. 2 C

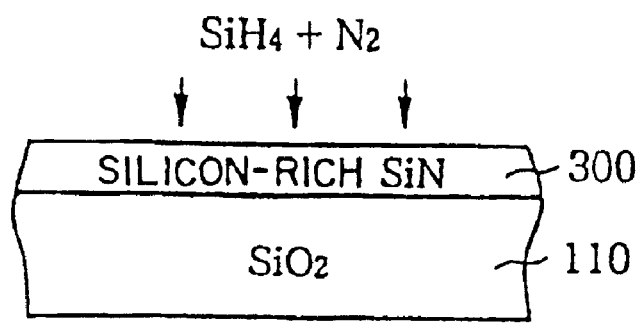
F I G. 4A
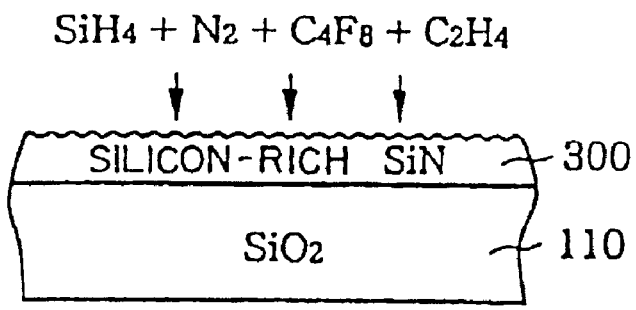
F I G. 4B
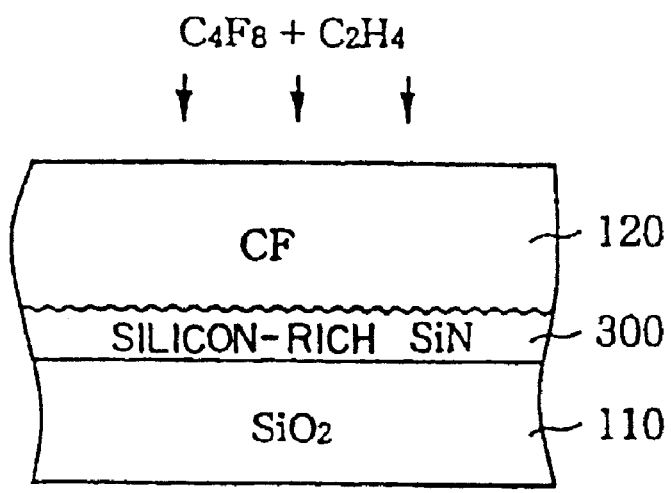
F I G. 4C

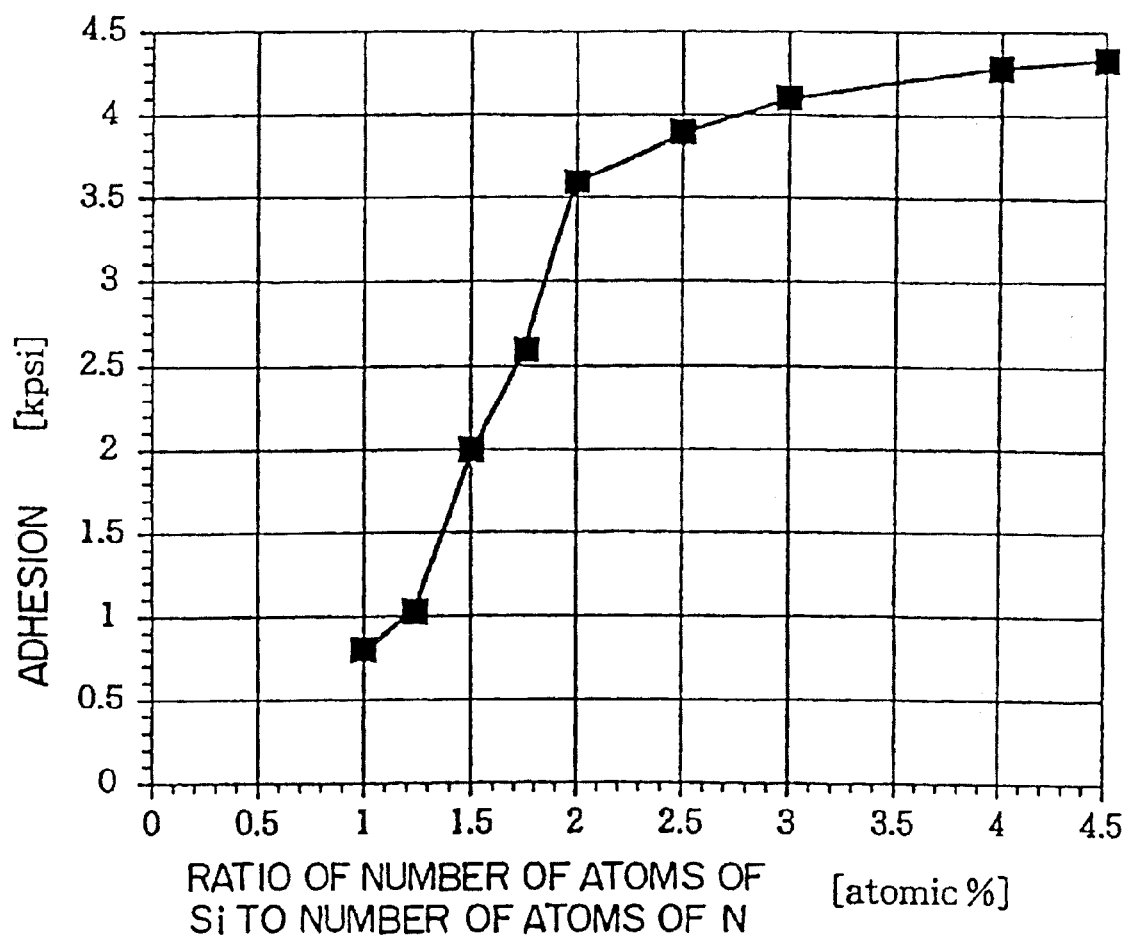
F I G. 5

| BASE LAYER | | ADHESIVE STRENGTH (kpsi) | |
|---|---|---|---|
| | | EMBODYING EXAMPLE | COMPARATIVE EXAMPLE |
| SiO₂ FILM | THERMAL OXIDE FILM | 8 | 1 OR LESS |
| | TEOS | 8 | 3 |
| | ICP | 8 | 2 |
| | PE | 8 | 2 |
| SiN FILM | | 8 | 3 |
| Al | | 7 | 5 |
| Ti | | 8 | 4 |
| TiN | | 8 | 4 |
| Al PATTERN | | 8 | 3 |
| Cu | | 6 | 1 OR LESS |

SEMICONDUCTOR DEVICE HAVING A FLUORINE-ADDED CARBON FILM AS AN INTER-LAYER INSULATING FILM

CROSS REFERENCE TO RELATED DOCUMENTS

This application is a Continuation of International Application No. PCT/JP99/05464, filed Oct. 5, 1999.

TECHNICAL FIELD

This invention relates to a semiconductor device using a fluorine-added carbon film as an inter-layer insulating film, and to a manufacturing method thereof.

BACKGROUND ART

In order to implement enhanced integration in semiconductor devices, various approaches have been developed, including miniaturizing patterns and stacking circuits in multiple layers, and one of such approaches is a technique of configuring wirings in multiple layers. To make a multilayered wiring structure, it is necessary to connect an n-th wiring layer and an (n+1)th wiring layer with a conductive layer while making a thin film, called inter-layer insulating film, in the remainder area other than the conductive layer.

One of typical inter-layer insulating films is a silicon oxide ($SiO_2$) film. Recently, inter-layer insulating films are required to be low in specific inductive capacity for increasing operation speeds of devices, and various researches are being made about materials of inter-layer insulating films. Specific inductive capacity of $SiO_2$ films is about 4, and efforts are being made toward excavation of materials having lower specific inductive capacities. As one of such efforts, SiOF film having a specific inductive capacity of 3.5 is under development toward realization. The inventor, however, is remarking fluorine-added carbon film (hereinafter called "CF film") having a still lower specific inductive capacity.

CF film is made by using a plasma apparatus that generates plasma by electron cyclotron resonance, for example, using argon gas, for example, as plasma gas, and using a gas containing compound gas of carbon and fluorine and hydrocarbon gas as the deposition gas, and exciting the deposition gas into plasma.

In actual semiconductor devices, it would be possible to stack such a CF film with a silicon-series insulating film like $SiO_2$ film or silicon nitride (SiN) film and a wiring layer of aluminum (Al) or copper (Cu). However, if CF film is stacked directly on a silicon-series insulating film, for example, there is estimated the problem, due to its structure similar to Teflon (polytetrafluoroethylene), that its adhesive force to silicon-series insulating films and metals is weak and easily peels off from those materials, as well as the problem, due to weakness of silicon-series insulating films, etc. to fluorine, that surfaces of silicon-series insulating films, etc. in contact with CF films are etched and damaged. Therefore, the inventor is progressing researches about using silicon carbide films as a contact layers to enhance adhesive forces between silicon-series insulating films, etc. and CF films.

In this case, in general, a silicon carbide film can be made between a SiO2 film and a CF film by exciting deposition gas for the silicon carbide film in the above-mentioned plasma device, for example, thereby to form the silicon carbide film on the $SiO_2$ film, and thereafter changing a deposition gas for the CF film to form the CF film on the silicon carbide film. In this connection, the inventor is continuing development of a technique for enhancing adhesion between $SiO_2$ films, for example, and CF films.

The invention has been made under those circumstances, and its object is to provide a semiconductor device and its manufacturing method effective for making a semiconductor device using a CF film as an insulting film to enhance adhesion between the CF film and a silicon-series insulating film or between the CF film and a metal wiring layer.

DISCLOSURE OF INVENTION

To attain the object, according to the invention, there is provided a semiconductor device having a plurality of wiring layers made of a conductive material and an electrically insulating layer interposed between the wiring layers, comprising: a first insulating layer adjacent to at least one of the wiring layers and made of a fluorine-containing carbon film; a second layer located on one side of the first insulating later opposite from said at least one of the wiring layers; and a contact layer made of a compound containing silicon and interposed between the first insulating layer and the second layer to prevent separation of the first insulating layer and the second layer.

The second layer may be an insulating layer containing silicon, such as insulating layer containing silicon oxide, for example. Alternatively, the second layer may be an insulating layer containing silicon nitride or may be a metal.

The contact layer of a compound containing silicon may be one containing silicon and nitrogen, or silicon and carbon. Alternatively, the contact layer of a compound containing silicon may be one including a first compound layer containing silicon and carbon and a second compound layer containing silicon and nitrogen. In this case, the first compound layer is located nearer to the first insulating layer, and the second compound layer is located nearer to the second layer.

A third compound layer containing silicon, carbon and nitrogen may be additionally provided between the first compound layer and the second compound layer. Further, a fourth compound layer containing silicon, carbon and fluorine may be additionally provided between the first compound layer and the first insulating layer. Furthermore, a fifth compound layer containing carbon and fluorine may be additionally provided between the fourth compound layer and the first insulating layer.

According to the invention, there is provided a semiconductor device manufacturing method comprising: a first deposition step for exciting a first deposition gas into plasma in a vacuum container, and forming a contact layer on one surface of an insulating film containing silicon, or a metal film, by the plasma; a second deposition step for exciting a second deposition gas containing carbon and fluorine into plasma in said vacuum container, and forming an insulating film made of fluorine-containing carbon film on a surface of the contact layer; and a deposition gas switching step carried out between the first deposition step and the second deposition step to introduce the second deposition gas into the vacuum container while the plasma of the first deposition gas is being partially generated in the vacuum container.

According to the invention, there is provided a semiconductor device manufacturing method comprising: a first deposition step for exciting a deposition gas into plasma in a vacuum container, and forming a contact layer on one surface of an insulating film containing silicon by the plasma; a second deposition step for exciting a deposition gas containing carbon and fluorine into plasma in the vacuum container, and forming an insulating film made of fluorine-containing carbon film on a surface of the contact layer; and a third deposition step for exciting a deposition gas containing carbon and fluorine in a vacuum container different from the vacuum container, and forming an insulating film made of fluorine-containing carbon film on a surface of the fluorine-containing carbon film from the plasma.

BRIEF DESCRIPTION OF THE DRAWINGS

FIGS. 2A through 2C are process diagrams that show steps of a method according to the invention in sequence;

FIGS. 4A through 4C are diagrams that show steps of another method according to the invention in sequence;

FIG. 5 is a characteristic diagram that shows relationship between composition of silicon-rich SiN film and adhesion between silicon-rich SiN film and CF film;

BEST MODE FOR CARRYING OUT THE INVENTION

A semiconductor device according to the invention uses a CF film as its inter-layer insulating film. Upon stacking the CF film and an insulating film containing silicon, such as $SiO_2$ film, or the CF film and a metal wiring layer, a contact layer is provided between the $SiO_2$ film or the like, and the CF film for the purpose of preventing their separation. The embodiment shown here is characterized in using a silicon carbide film (hereinafter called "SiC film") containing silicon (Si) and carbon (C) as a contact layer and stacking the SiC film and the CF film substantially continuously. The SiC film used in the invention means a film containing Si and C as its components, and does not mean that component Si and component C are contained by 1:1.

Figure 1:
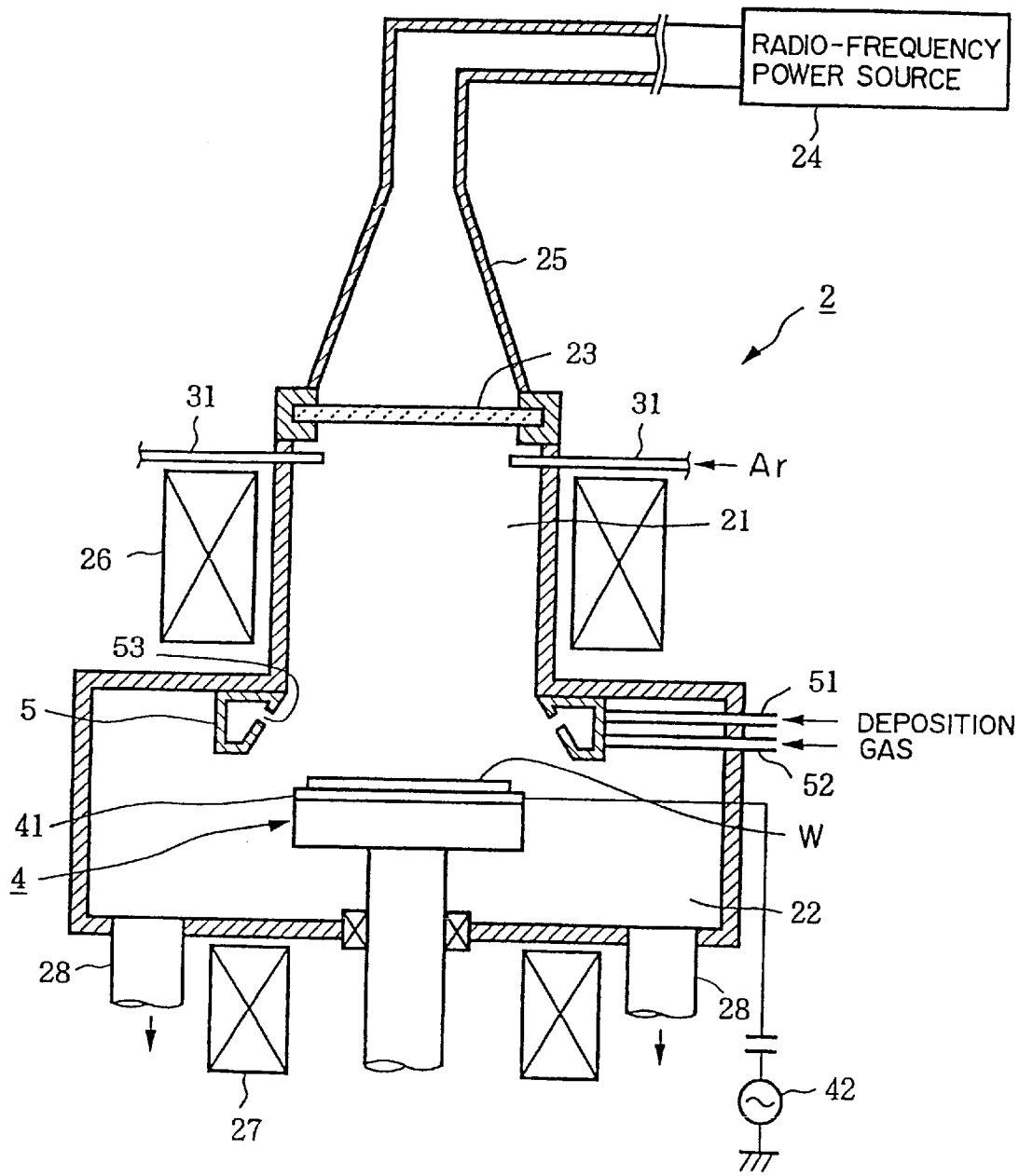
FIG. 1 is a vertical sectional view of a plasma film forming or deposition device for carrying out a method according to the invention.

First, a plasma deposition apparatus usable for manufacturing the semiconductor device according to the invention will be described with reference to FIG. 1. This apparatus includes a vacuum container 2 made of aluminum, for example. The vacuum container 2 includes a cylindrical first vacuum chamber 21 located at an upper position for generating a plasma, and a cylindrical second vacuum chamber 22 coupled under the first vacuum chamber 21 in communication therewith and having a larger diameter than the first vacuum chamber 21. The vacuum chamber 1 is grounded and held in zero potential.

The top end of the vacuum container 2 is open, and here is air-tightly mounted a transmittable window 23 made of a material such as quartz, which microwaves are permitted to pass through, to maintain vacuum in the vacuum container 2. Outside the transmittable window 23, there is provided a wave-guide 25 connected to a radio-frequency power source 24 for generating microwaves of 2.45 GHz, for example. Microwaves generated in the radio-frequency power source 24 are guided by the wave guide 25 in the TE mode, for example, or microwaves guided in the TE mode are converted into the TM mode, such that they can be introduced from the transmittable window 23 into the first vacuum chamber 21.

On a side wall defined by the first vacuum chamber 21, gas nozzles 31 are provided in equal-interval locations along the circumferential direction, for example, and a plasma generating gas source, for example, which is not illustrated, is connected to the gas nozzles 31 such that plasma-generating gas, such as Ar gas, can be evenly, uniformly supplied to the upper part of the first vacuum chamber 21.

Located inside the second vacuum chamber 22 is a support table 4 for a semiconductor wafer (hereinafter called "wafer") W to be processed, in confrontation with the first vacuum chamber 21. The support table 4 has an electrostatic chuck 41 on its surface, a d.c. current source (not shown) is connected to an electrode of the electrostatic chuck 41 for attracting the wafer W, and a radio-frequency power source 42 is also connected to the electrode to apply a bias voltage for pulling ions onto the wafer.

On the other hand, at an upper portion of the second vacuum chamber 22, which is in communication with the first vacuum chamber 21, a ring-shaped deposition gas supply portion 5 is provided. The deposition gas supply portion 5 is supplied with deposition gases from a gas supply pipe 51 and a gas supply pipe 52, respectively, and these gases are supplied from gas holes 53 provided along the inner circumferential surface into the vacuum container 2.

In a close location around the sidewall defining the first vacuum chamber 21, a ring-shaped main electromagnetic coil 26, for example, is provided, and under the second vacuum chamber 22 is provided a ring-shaped auxiliary electromagnetic coil 27. Additionally, connected to the bottom of the second vacuum chamber 22 are discharge pipes 28, which may be located at two symmetric positions about the center axis of the vacuum chamber 22, for example.

Next a method according to the invention will be explained, which is carried out with the above-explained apparatus. First, a gate valve, not shown, which is provided at a portion of the side wall of the vacuum chamber 2 is opened, and a wafer W having an aluminum wiring formed on its first insulating film containing silicon, such as $SiO_2$ film, is transported by a transport arm, not shown, through a loadlock chamber, not shown, onto the support table 4. The electrostatic chuck 41 electrostatically attract the wafer W, and a SiC film 200 is deposited on the surface of the $SiO_2$ film as shown in FIG. 2A (first deposition step).

More specifically, after hermetically sealing the inner space of the vacuum chambers by shutting the gate valve, the inner atmosphere is discharged through the discharge pipes 28 to evacuate to a predetermined vacuum, the interior of the vacuum container 2 is maintained in a predetermined process pressure, such as 0.1 Pa, and the process temperature is adjusted to 400° C., for example. Under the condition, Ar gas is first introduced from the gas nozzles 31 into the first vacuum chamber 21 at a flow rate of 150 sccm, and SiC film forming gases as the first deposition gases, such as $SiH_4$ gas and $C_2H_4$ gas, are introduced into the second vacuum chamber 22 at flow rates of 30 sccm and 20 sccm, respectively, from the deposition gas supply portion 5. Then, a radio-frequency wave (microwave) of 2.45 GHz, 2.4 kW is supplied from the radio-frequency power source 24, and simultaneously, a bias voltage of 13.56 MHz, 0 kW is applied by the radio-frequency power source 42 to the support table 4.

In this manner, microwaves from the radio-frequency power source 24 travel through the waveguide 25 to the ceiling of the vacuum container 2, and it is introduced into the first vacuum chamber 21, passing through the transmittable window 23. Additionally, a mirror magnetic field oriented from the upper portion of the first vacuum chamber 21 toward the lower portion of the second vacuum chamber 22 is formed inside the vacuum container 2 by the main electromagnetic coil 26 and the auxiliary magnetic coil 27 such that the intensity of the magnetic field becomes 875 Gauss near the lower portion of the first vacuum chamber 21, for example.

Thus, an electron cyclotron resonance is produced due to cooperative function between the magnetic field and the microwaves, and the electron cyclotron resonance excites the Ar gas into plasma and into a high density gas. By thus exciting the Ar gas into plasma, the plasma is stabilized. The thus produced plasma flows through the first vacuum chamber 21 into the second vacuum chamber 22 to excite the $SiH_4$ gas and $C_2H_4$ gas into a plasma and produce active radicals, whereby a SiC film 200 is deposited on the $SiO_2$ film 110.

After the deposition of the SiC film is continued for three second, for example, a step of switching deposition gases is conducted as shown in FIG. 2B. More specifically, under the condition with a radio-frequency power (radio-frequency power source 24) of 2.4 kW, a biasing power (radio-frequency power source 42) of 0 kW, a magnetic field in the form of a mirror electric field, a process temperature of 400° C. and a process pressure of 0.5 Pa, Ar gas, $SiH_4$ gas, $C_2H_4$ gas, and $C_4F_8$ gas are introduced at flow rates of 150 sccm, 30 sccm, 20 sccm and 80 sccm, respectively, and the SiC film deposition gases and the CF film deposition gases are excited into plasma by electron cyclotron resonance mentioned above. The step of switching the deposition gases is executed for about 1 second. The Ar gas is a plasma generating gas, the $SiH_4$ gas and the $C_2H_4$ gas are SiC film deposition gases, and the $C_4F_8$ gas and the $C_2H_4$ gas are CF film deposition gases (second deposition gas). In FIG. 2B, the corrugated shape of the surface of the SiC film exhibits that the surface has active bonds.

After that, as shown in FIG. 2C, a step of depositing the CF film (second deposition step) is performed. More specifically, under the condition with a radio-frequency power (radio-frequency power source 24) of 2.4 kW, a biasing power (radio-frequency power source 42) of 1.5 kW, a magnetic field in the form of a mirror electric field, a process temperature of 400° C. and a process pressure of 0.5 Pa, Ar gas and $C_4F_8$ together with $C_2H_4$ gas are introduced at flow rates of 150 sccm, 80 sccm and 20 sccm, respectively, and the deposition gases are excited into plasma by electron cyclotron resonance. On the other hand, by attracting Ar ions, which are plasma ions, onto the wafer W by the use of the biasing voltage for the purpose of attracting plasma, parts of the CF film deposited on corners at open ends of pattern-making recesses in the wafer surface are removed by the use of sputtering etching function of Ar ions to gradually enlarge the width of the open ends of the recesses. The deposition step of forming the CF film in the recesses is conducted and continued until a predetermined thickness is obtained.

Through the above-described process, a semiconductor device having the Sic film 200, 500 Angstroms thick, for example, between the $SiO_2$ film and the CF film 120. When actually manufacturing devices, however, the CF film is thereafter etched into a predetermined pattern, and a W wiring is formed by burying grooves with a W film, for example.

Since this method includes the step of switching the deposition gases between the SiC film deposition step and the CF film deposition step and introduces SiC film deposition gases and CF film deposition gases simultaneously, the films are stacked continuously. Continuous deposition of films means in the present invention that, in case of stacking a plurality of films in a vacuum container and switching deposition gases, deposition gases for a film to be deposited later are introduced while part of deposition gases for a film to be deposited earlier is still generating plasma in the vacuum container.

The use of the deposition gas switching step contributes to stabilizing plasma and simultaneously enhancing adhesion between the $SiO_2$ film 110 and the CF film 120. As a result of measuring the adhesion between $SiO_2$ films 110 and CF films 120 in semiconductor devices actually prepared in the above-described process by the Sebastian method (stud pull), adhesion of not lower than 2.5 kpsi was confirmed.

For comparison purposes, adhesion was similarly measured with respect to samples having a CF film directly stacked on a $SiO_2$ film (Comparative Example 1) and samples prepared by introducing deposition gases for the later step after completely discharging deposition gases for the preceding step from the vacuum container (Comparative Example 2). Comparative Examples 1 and 2 were prepared in the above-mentioned plasma deposition apparatus, and the deposition conditions of Comparative example 1 were the same as the deposition conditions of the CF film according to the instant embodiment. Further, Comparative Example 2 was prepared by stacking the SiC film under the same deposition conditions as that of the SiC film in the instant embodiment, and stacking the CF film under the same deposition conditions as that of the CF film in the instant embodiment, and by starting deposition of the CF film after completing deposition of the SiC film.

Adhesion between the $SiO_2$ films and the CF films in Comparative Examples 1 and 2 prepared in the above manner was 1 kpsi or lower for Comparative Example 1, and 2 kpsi for Comparative Example 2. From these measurements, the semiconductor device according to the present embodiment was confirmed to have a higher adhesion than those of Comparative Example 1 and Comparative Example 2, presumably for the following reason.

Figure 3A:
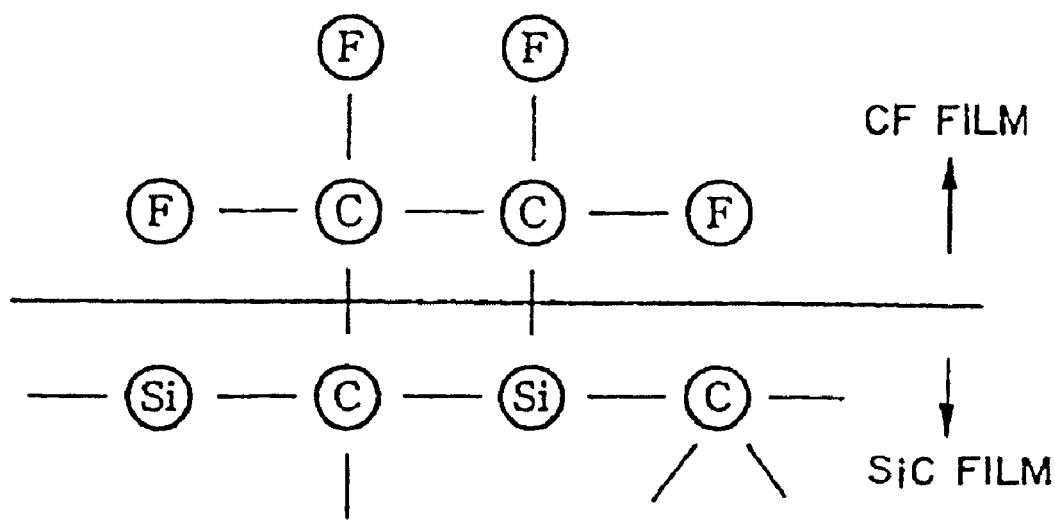
FIG. 3A is a diagram for explaining the operation of the method according to the invention.

That is, since the embodiment simultaneously introduces both the SiC film deposition gas and the CF film deposition gas during the deposition gas switching step, Si plasma, C plasma and F plasma concurrently exist during this step. Since this step ends in a short time around one second, for example, the Si plasma, etc. are not as much as to form a film including a SiC film and a CF film together. However, along the boundary between the SiC film 200 and the CF film 120, bonds are formed also between C of the SiC film and C of the CF film 120 as shown in FIG. 3A, and as a result, bonds are formed to bridge over both the SiC film 200 and the CF film 120. Probably, this is the reason of the high adhesion between them. Further, since both the $SiO_2$ film 110 and the SiC film 20 are silicon-series insulating films and their bonding force is inherently high, this seems to result in that high adhesion between the $SiO_2$ film 110 and the CF film 120.

Figure 3B:
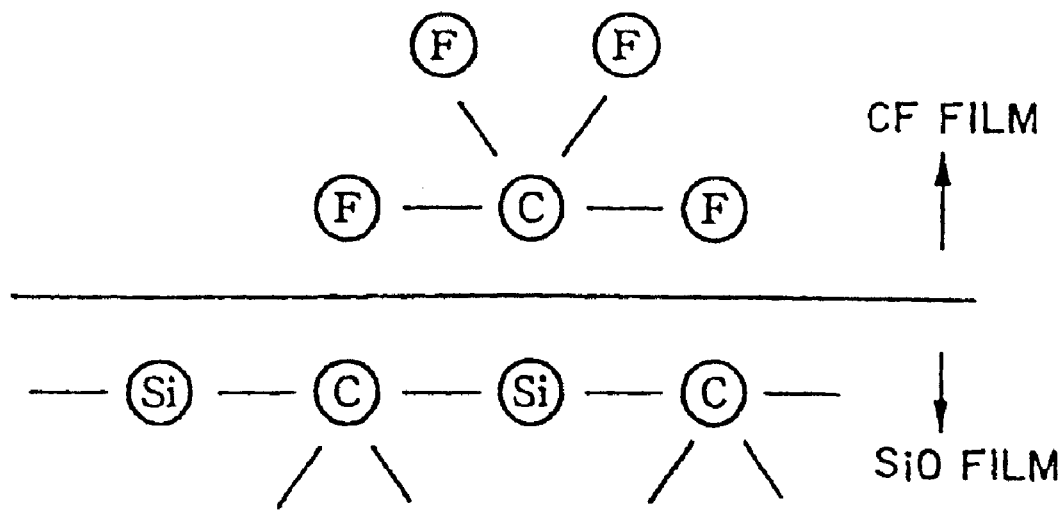
FIG. 3B is a diagram for explaining the operation of a comparative example.
Figure 6:
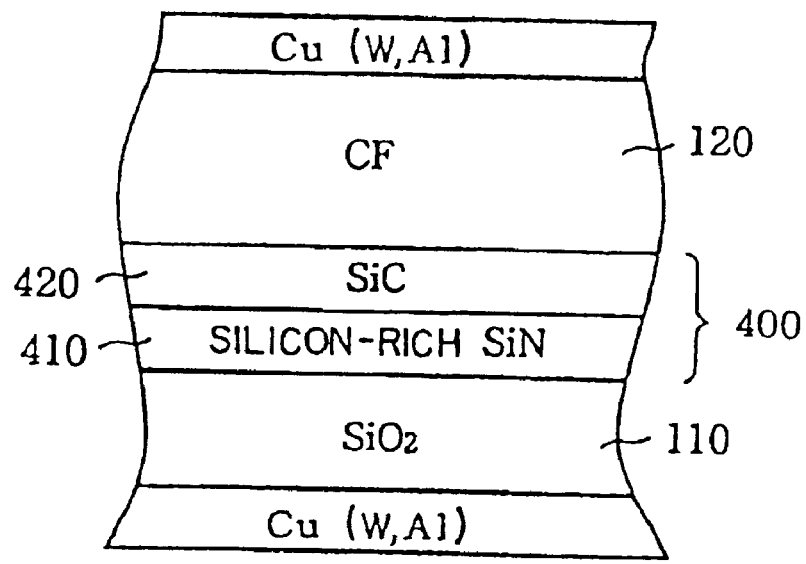
FIG. 6 is a cross-sectional view that shows of a further embodiment of the semiconductor device according to the invention.

On the other hand, in Comparative Example 2 similarly using the SiC film as its contact layer, deposition of the SiC film and deposition of the CF film are conducted in separate steps, and deposition gas for the SiC film and deposition gas for the CF film are not introduced continuously. Therefore, during deposition of the CF film, deposition gas for the SiC film does not exists substantially. As a result, as shown in FIG. 3B, the SiC film and the CF film do not make bonds between them along their boundary, and adhesion between the SiC film and the CF film becomes lower than that of the semiconductor device according to the present embodiment. This would be the reason of that low adhesion between the $SiO_2$ film and the CF film.

For the purpose of confirming adhesion of CF films to various kinds of base layers, such as $SiO_2$ films formed by various techniques, like a $SiO_2$ film made by thermal oxidation, $SiO_2$ film made by a sol-gel technique (to be described later) using a parallel-plate-type plasma device and a $SiO_2$ film formed in an ICP plasma device (to be described later), and to silicon nitride films, Al, Cu. and so on, samples were prepared by continuously depositing SiC films and CF films on those $SiO_2$ films, Al and others under conditions similar to those of the above-explained process, and tests were conducted to confirm their adhesive forces. According to the tests, in all of the samples, adhesive force between the $SiO_2$ film, or the like, and the CF film was 2.5 kpsi or more. The sol-gel technique pertains to a technique for obtaining a $SiO_2$ film by applying a liquid prepared by dispersing colloids of TEOS (tetraethoxysilane: $Si(C_2H_5O)_4$) in an organic solvent such as ethanol solution onto a semiconductor wafer, then gelling the applied film and thereafter drying it.

From the above, it is apparent that the instant embodiment is applicable not only to combinations of $SiO_2$ films and CF films but also to between silicon nitride films and CF films and between metals and CF films, and also effective to improve their adhesive forces and that the instant invention can prevent separation between silicon-series insulating films or metal wiring layers and CF films even when using a CF film as an inter-layer insulating film to make a multi-layered wiring.

A further embodiment of the invention will be described. Difference of the instant embodiment from the foregoing embodiment lies in the use of a silicon-rich silicon nitride film (hereinafter called SiN film) 300 containing silicon and nitrogen (N), for example, as the contact layer between the $SiO_2$ film 110 and the CF film 120, in lieu of the SiC film 200. The silicon-rich silicon nitride film is a silicon nitride film containing Si atoms in a ratio not smaller than 1 relative to the number of N atoms, but from the tests shown below, it is preferable to use a silicon nitride film containing Si atoms in a ratio not smaller than 1.5 relative to the number of N atoms. Further, the "SiN film" used in the invention means a film containing Si and N as its components, and does not mean that component Si and component N are contained in a ratio of 1:1.

The semiconductor device according to the instant embodiment is manufactured by first conducting a deposition step of the silicon-rich SiN film (first deposition step), then executing a step of switching deposition gases and subsequently executing a deposition step of the CF film (second deposition step). The step of depositing the silicon-rich SiN film is executed in the plasma deposition apparatus described before for 15 seconds, for example, with a radio-frequency power of 2.4 kW, a biasing power of 0 kW, a magnetic field in the form of a mirror magnetic field, a process temperature of 360° C., a process pressure of 0.2 Pa, while introducing a gas for creating plasma, such as Ar gas and first deposition gases for deposition of the SiN film, such as $SiH_4$ gas and $N_2$ gas, in flow rates of 200 sccm, 20 sccm and 5 sccm, respectively. In this step, the deposition gases are excited into plasma by electron cyclotron resonance, and as shown in FIG. 4A, the silicon-rich SiN film 300 is formed on the top surface of the $SiO_2$ film 110, for example.

The step of switching deposition gases is executed in the plasma deposition apparatus for 1 second, for example, with a radio-frequency power of 2.4 kW, a biasing power of 0 kW, a magnetic field in the form of a mirror magnetic field, a process temperature of 360° C., a process pressure of 0.2 Pa, while introducing Ar gas, $SiH_4$ gas and $N_2$ gas, and second deposition gases for deposition of the CF film, such as $C_2H_4$ and $C_4F_8$, in flow rates of 200 sccm, 20 sccm, 5 sccm, 30 sccm and 80 sccm, for example (see FIG. 4B). In this step, deposition gases for stacking the silicon-rich SiN film and the CF film are excited to plasma by electron cyclotron resonance.

The step of depositing the CF film shown in FIG. 4C is executed in the plasma deposition apparatus until the film grows to a predetermined thickness with a radio-frequency power of 2.4 kW, a biasing power of 1.5 kW, a magnetic field in the form of a mirror magnetic field, a process temperature of 400° C., a process pressure of 0.5 Pa, while introducing Ar gas, $C_4F_8$ gas and $C_2H_4$ gas in flow rates of 150 sccm, 80 sccm and 20 sccm, respectively. In this step, those deposition gases are excited to plasma, and the CF film 120 is formed on the top surface of the silicon-rich SiN film 300. Through the above process, the semiconductor device having the silicon-rich SiN film 300, 500 Angstrom thick, for example, is interposed between the $SiO_2$ film 110 and the CF film 120.

The above-described method uses the SiN film as the contact layer. Since this SiN film 300 prohibits fluorine to pass therethrough, and is therefore effective to protect the $SiO_2$ film 110. In addition, since the silicon-rich SiN film 300, which contains Si atoms in a ratio of 1.5 or more relative to the number of N atoms, is used as the contact layer, adhesion between the silicon-rich SiN film 300 and the CF film 120 can be enhanced.

The inventor is aware of the fact that adhesion between a silicon-rich SiN film and a CF film depends on the ratio of Si atoms relative to the number of N atoms in the SiN film. Actually, the inventor prepared CF films on silicon-rich SiN films different in that ratio, and measured adhesion between these SiN films and CF films. The result is shown in FIG. 5. As the ratio of Si atoms relative to the number of N atoms increases, adhesion between these films became higher, and when the ratio of S atoms relative to the number of N atoms was 1.5 or larger, adhesion was 2 kpsi or more.

Further, since the instant embodiment introduces deposition gases for the silicon-rich SiN film and deposition gases for the CF film simultaneously in the step of switching deposition gases between the deposition step of the contact layer and the deposition step of the CF film, it provides the effect of enhancing adhesion between the $SiO_2$ film and the CF film. By actually preparing semiconductor devices through the above process and measuring adhesion between the $SiO_2$ film 110 and the CF film 120 in the same manner as explained above, adhesion not less than 3 kpsi was confirmed. In this measurement, the ratio of Si atoms relative to the N atoms in the silicon-rich SiN film was set to 1.5.

For comparison purposes, samples (Comparative Example 3) were prepared by the method of first forming the silicon-rich SiN film between the $SiO_2$ film and the CF film, and starting the next deposition after completing the deposition, and adhesion was measured in the same manner. As a result, adhesion between the $SiO_2$ film and the CF film was 2 kpsi. This Comparative Example 3 was prepared in the plasma deposition apparatus, using the deposition conditions of the silicon-rich SiN film according to the instant embodiment for depositing the silicon-rich SiN film, and using the deposition conditions of the CF film of the instant embodiment for depositing the CF film, and starting deposition of the CF film after completing deposition of the silicon-rich SiN film.

The semiconductor device obtained by the method according to the instant embodiment can be enhanced in adhesion as compared with Comparative Example 3. Its reason can be assumed as follows. That is, since the present embodiment introduces deposition gases for the silicon-rich SiN film and deposition gases for the CF film simultaneously during the step of switching deposition gases, similarly to the foregoing embodiment, bonds are formed between the silicon-rich SiN film 300 and the CF film 120 along their boundary, and this contributes to increasing their adhesion. In addition to this, since both the $SiO_2$ film 110 and the silicon-rich SiN film 300 are silicon-series insulating films and their bonding force is inherently high, this results in that high adhesion between the $SiO_2$ film 110 and the CF film 120.

Furthermore, in order to confirm adhesion of CF films with base layers such as $SiO_2$ films made by various techniques, like a $SiO_2$ film formed by thermal oxidation, a $SiO_2$ film formed by a sol-gel method using a parallel-plate-type plasma apparatus, a $SiO_2$ film made in a ICP plasma apparatus, a $SiO_2$ film made in a parallel-plate-type plasma apparatus, a SiN film, Al, Cu, and so on, samples were prepared by continuously stacking silicon-rich SiN films and CF films under the same conditions as used in the above-described process on surfaces of those $SiO_2$ films, Al, and others, as base films, and tests were conducted to confirm adhesion. As a result, in all of these samples, adhesion not lower than 3 kpsi was confirmed between the CF films and $SiO_2$ films, etc.

From the above, it is apparent that the instant embodiment is applicable also to a combination of a SiN film and a CF film and a combination of a metal and a CF film in addition to the combination of the $SiO_2$ film and the CF film, and also in these combinations, it is effective to improve their adhesion and can prevent separation of films, which is liable to occur between a CF film and a silicon-series insulating film or a metal wiring layer.

Next, a still further embodiment of the invention will be described. A difference of the semiconductor device according to the instant embodiment from the above-described semiconductor device lies in that a contact layer 400 between the $SiO_2$ film 110 and the CF film 110 is formed by stacking a silicon-rich SiN film 410 and a SiC film 420 in this order.

The semiconductor device according to this embodiment is manufactured in the above-mentioned plasma deposition device, for example, as follows. With a radio-frequency power of 2.4 kW, a biasing power of 0 kW, a magnetic field in the form of a mirror magnetic field, a process temperature of 360° C., a process pressure of 0.2 Pa, there were introduced a plasma generating gas, such as Ar gas, and deposition gases for the silicon-rich SiN film, such as $SiH_4$ gas and $N_2$ gas, in flow rates of 200 sccm, 20 sccm and 5 sccm, respectively, and these gases were excited into plasma. As a result, a silicon-rich SiN film (with Si atoms by the ratio of 1.5 relative to the number of N atoms) 410 of a thickness around 500 Angstroms, for example, was deposited on the $SiO_2$ film 110, for example.

After that, with a radio-frequency power of 2.4 kW, a biasing power of 0 kW, a magnetic field in the form of a mirror magnetic field, a process temperature of 400° C., a process pressure of 0.1 Pa, there were introduced Ar gas or other plasma generating gas, and SiC film deposition gases, such as $SiH_4$ gas and $C_2H_4$ gas, in flow rates of 150 sccm, 30 sccm and 20 sccm, respectively, and these gases were excited into plasma. As a result, a SiC film 420 approximately 500 Angstrom thick, for example, was stacked on the silicon-rich SiN film 410.

Subsequently, with a radio-frequency power of 2.4 kW, a biasing power of 1.5 kW, a magnetic field in the form of a mirror magnetic field, a process temperature of 400° C., a process pressure of 0.5 Pa, there were introduced a plasma generating gas such as Ar gas, and CF film deposition gases such as $C_4F_8$ gas and $C_2H_4$ gas, in flow rates of 150 sccm, 80 sccm and 20 sccm, respectively, and the gases were excited into plasma, the CF film 120 of a predetermined thickness is formed on the SiC film 420.

The instant embodiment has been made based on the inventor's consciousness that a silicon-rich SiN film is more adhesive to a $SiO_2$ film than a SiC film, and a SiC film is more adhesive to a CF film than a silicon-rich SiN film. Thus, since the contact layer 400 including the silicon-rich SiN film 410 and the SiC film 420 in this sequence is interposed between the $SiO_2$ film 110 and the CF film 120, adhesion between the $SiO_2$ film 110 and the CF film 120 can be enhanced significantly. Measurement of adhesion between the $SiO_2$ film 110 and the CF film 120 of a semiconductor device actually prepared by the above-described process, showed an adhesion of 5 through 6 kpsi or more.

For purposes of comparison, samples (Comparative Example 4) each having a SiC film between a $SiO_2$ film and a CF film and samples (Comparative Example 5) each having a silicon-rich SiN film between a $SiO_2$ film and a CF film were prepared, and their adhesive forces were measured similarly. As a result, adhesive force between the $SiO_2$ film and the CF film was 2 kpsi in Comparative Example 4, and separation of films was observed between the $SiO_2$ film and the SiC film. In Comparative Example 5, however, adhesive force was 3 kpsi, and separation of films was observed between the silicon-rich SiN film and the CF film.

Comparative Example 4 was prepared with the above-described plasma deposition apparatus by stacking the SiC film under the same conditions as used for stacking the SiC film in the instant embodiment and stacking the CF film under the same conditions as used for stacking the CF film in the instant embodiment. Comparative Example 5 was prepared with the same plasma deposition device by stacking the silicon-rich SiN film under the same conditions as used for stacking the silicon-rich SiN film in the instant embodiment and stacking the CF film under the same conditions as used for stacking the CF film in the instant embodiment.

In the semiconductor device according to the present embodiment, the ratio of the number of Si atoms relative to the number of N atoms in the SiN film 410 formed between the SiO$_2$ film 110 and he SiC film 420 is not limited, and a SiN film other than silicon-rich SiN film may be used. Further, the base film of the silicon-rich SiN film 410 is not limited to the SiO$_2$ film 110, and it may be replaced by a silicon-rich SiN film containing Si atoms by a ratio of 1 or more relative to the number of N atoms, or a metal, for example.

In order to confirm adhesion of CF films with base layers such as SiO$_2$ films made by various techniques, like a SiO$_2$ film by thermal oxidation, a SiO$_2$ film by a sol-gel method using a parallel-plate-type plasma apparatus, a SiO$_2$ film made in an ICP plasma apparatus, a SiO$_2$ film made in a parallel-plate-type plasma apparatus, a silicon-rich SiN film containing Si atoms in a ratio of 1.5 relative to the number of N atoms, Al, and Cu, samples were prepared by depositing silicon-rich SiN films, SiC films and CF films under the same conditions as used in the above-described process on top surfaces of those SiO$_2$ films, Al, and others, as base films, and tests were conducted to confirm adhesion. As a result, in all of the samples, adhesion not lower than 5 kpsi was confirmed between the CF films and SiO$_2$ films, etc.

From the above, it is apparent that the instant embodiment is applicable also when depositing CF films on silicon-series films other than SiO$_2$ films, or metals, and it is possible to prevent separation of films, which is liable to occur between CF films and silicon-series insulating films or metal wiring layers.

Figure 7:
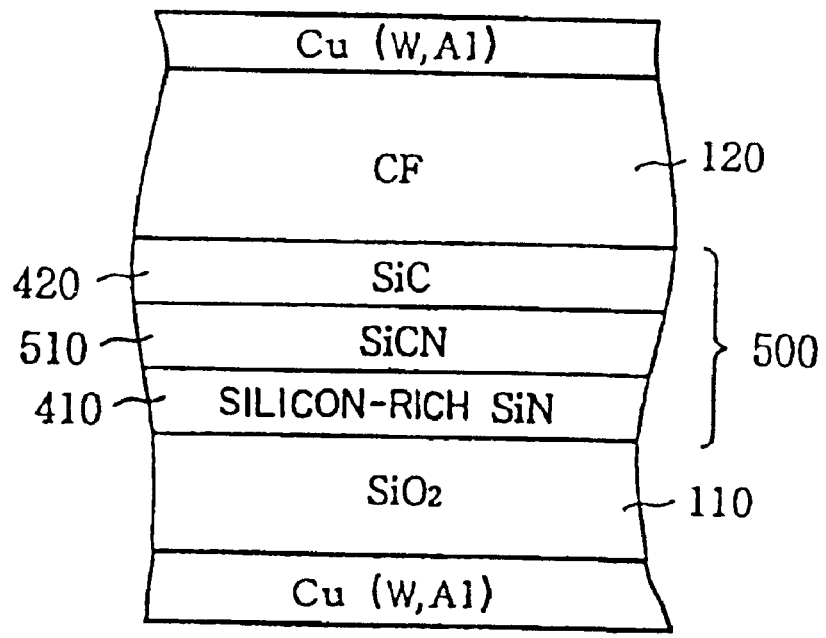
FIG. 7 is a cross-sectional diagram that shows a still further embodiment of the semiconductor device according to the invention.
Figure 8:
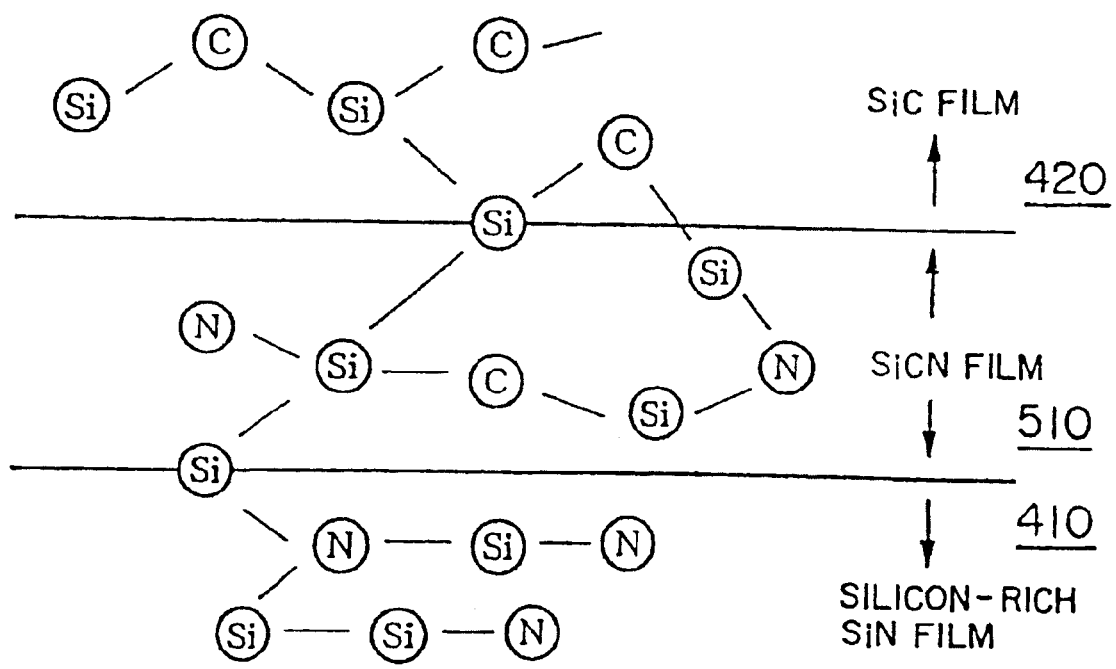
FIG. 8 is an explanatory diagram for explaining the operation of the semiconductor device.

A still further embodiment of the invention will be described, which is characterized in forming a contact layer 500 with a SiCN film 510 interposed between the silicon-rich SiN film 410 and the SiC film 420 of the above-mentioned contact layer 400, as shown in FIG. 7.

The semiconductor device of this type is manufactured in the same plasma deposition apparatus, for example, as follows. That is, using the same process as used in the former embodiment, for example, the silicon-rich SiN film (with Si atoms by a ratio of 1.5 relative to the number of N atoms) 410 of a thickness around 300 Angstroms, for example, is formed on the SiO$_2$ film 110, for example.

After that, with a radio-frequency power of 2.4 kW, a biasing power of 0 kW, a magnetic field in the form of a mirror magnetic field, a process temperature of 360° C., a process pressure of 0.2 Pa, there were introduced Ar gas or other plasma generating gas, and SiCN film deposition gases, such as SiH$_4$ gas, C$_2$H$_4$ gas and N$_2$ gas, in predetermined flow rates, respectively, and they were excited into plasma. The SiCN film 510 approximately 400 Angstrom thick, for example, is formed on the silicon-rich SiN film 410. This SiCN film is a mixture of a silicon-rich SiN film and a SiC film, and contains Si, N and C.

Subsequently, the SiC film 420 is formed on the top surface of the SiCN film 510 in the same process as used in the foregoing embodiment to form the contact layer 500 with the entire thickness of 1000 Angstroms. After that, the CF film 120 of a predetermined thickness is formed on the top surface of the SiC film 420 in the same process as used in the foregoing embodiment, for example.

In this semiconductor device, the contact layer 500 includes the silicon-rich SiN film 410 highly adhesive to SiO$_2$ film and located in contact with the SiO$_2$ film 110, the SiC film 420 highly adhesive to CF film and located in contact with the CF film 120, and the SiCN film 510 is located between these silicon-rich SiN film 410 and CF film 120. Therefore, adhesion between the SiO$_2$ film 110 and the CF film 120 can be enhanced significantly. Measurement of their adhesion by using semiconductor devices actually prepared in the above-described process, showed adhesion of 6.5 through 7 kpsi.

The following reason is assumable about such a high adhesion. That is, as a result of the SiCN film 510 being formed between the silicon-rich SiN film 410 and the SiC film 420, Si—N bonds, and Si—C bonds would be formed near the boundary between the silicon-rich SiN film 410 and the SiCN film 510 and near the boundary between the SiC film 420 and the SiCN film 510, and these bonds easily make a network of bonds. Therefore, adhesion of the silicon-rich SiN film 410 and the SiC film 420 is increased, and this results in enhancing adhesion between the SiO$_2$ film 110 and the CF film.

In this semiconductor device, the silicon-rich SiN film 410 need not be limited in the ratio of the number of Si atoms relative to the number of N atoms, and a SiN film other than such a silicon-rich SiN film may be used. Further, by replacing the base film with SiO$_2$ films made by thermal oxidation (thermal oxide films), SiO$_2$ films made by a sol-gel method in a parallel-plate-type plasma apparatus (TEOS), SiO$_2$ films made in an ICP plasma apparatus (ICP), SiO$_2$ films made in a parallel-plate-type plasma apparatus (PE), SiN films containing Si atoms in a ratio of 0.75 relative to the number of N atoms, Al, titanium (Ti), titanium nitride (TiN), Al pattern and Cu, adhesion between these base films and CF films was reviewed, and the result shown in FIG. 9 was obtained.

In these tests, samples were prepared by depositing silicon-rich SiN films, SiCN films, SiC films and CF films in the same process as explained above on top surfaces of those base layers such as SiO$_2$ films, aluminum and others, and their adhesion was reviewed. Additionally, samples as comparative examples were also prepared by making CF films directly on top surfaces of those base layers (using the same process as explained above for deposition of the CF films), and their adhesion was reviewed similarly.

In semiconductor devices according to the instant embodiment, all samples exhibited adhesive forces not lower than 6 kpsi between SiO$_2$ films and CF films, and they were confirmed to be much more adhesive than comparative examples. From this, it has been confirmed that the instant embodiment is effective for improving adhesion of CF films to silicon-series films or metals, and if the contact layer 500 is used, separation of films liable to occur between silicon-series insulating films or metal wiring layers and CF films can be prevented, and the embodiment is applicable also when silicon-rich SiN films containing Si atoms in a ratio of 1 or more relative to the number of N atoms, or metals, are used as base layers.

Through further various tests about the above-described semiconductor device, it was observed that when thickness of the contact layer 500 reaches 1000 Angstroms, specific inductive capacity of the semiconductor device becomes as high as approximately 3. Then, thickness of the contact layer 500 was optimized taking its specific inductive capacity and adhesion into consideration. As a result, when the silicon-rich SiN film 510 was 150 Angstroms thick, SiCN film 520 200 Angstroms thick and SiC film 530 150 Angstroms thick to make up the thickness of 500 Angstroms as the entire contact layer 500, adhesion between the SiO$_2$ film 110 and the CF film 120 could be about 8 kpsi, and the specific inductive capacity around 2.6 could be obtained.

Figures 9, 10:
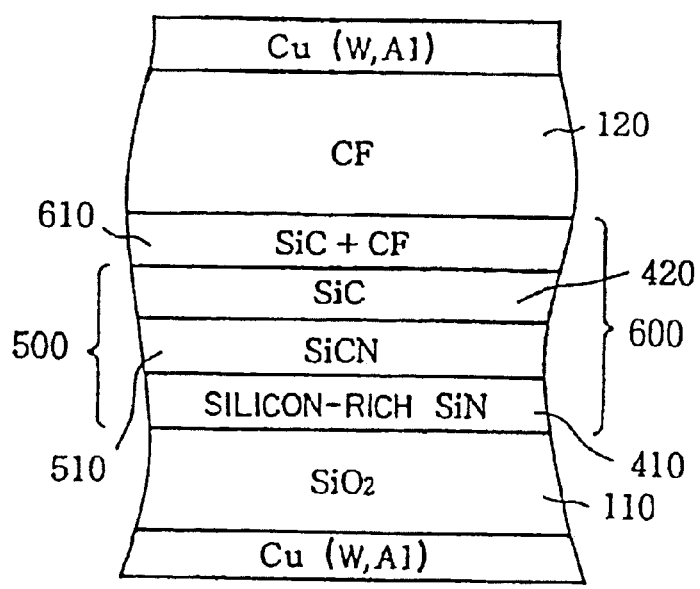
FIG. 9 is a table that shows a result of measurement about adhesion of the semiconductor device.
FIG. 10 is a cross-sectional view that shows a yet further embodiment of the semiconductor device according to the invention.

A yet further embodiment of the invention will be described with reference to FIG. 10. The contact layer 500 shown in FIG. 10 exhibits significantly high adhesion between the SiO$_2$ film 110 and the CF film 120. However, when a Ti layer, TiN layer and TiF layer, for example, were formed on the top surface of the CF film, separation occurred between the SiC film and the CF film. The instant embodiment is intended to prevent this phenomenon, and characterized in forming a mixture layer 610, which is a mixture of SiC film and CF film and contains Si, C and F, between the contact layer 500 and the CF film 120 as shown in FIG. 10.

This type of semiconductor device is manufactured in the plasma deposition apparatus, for example, in the following manner. In the same process as used in the foregoing embodiment, for example, a silicon-rich SiN film 410 (containing Si atoms in a ratio of 1.5 relative to the number of N atoms) having a thickness around 100 Angstroms, for example, a SiCN film 510 having a thickness around 100 Angstroms, for example, and a SiC film 420 having a thickness around 100 Angstroms, for example, are stacked to form a contact layer 500.

After that, with a radio-frequency power of 2.4 kW, a biasing power of 0 kW, a magnetic field in the form of a mirror magnetic field, a process temperature of 400° C. and a process pressure of 0.5 Pa, there were introduced a plasma generating gas such as Ar gas, sic film deposition gases and CF film deposition gases such as SiH$_4$ gas, C$_2$H$_4$ gas and C$_4$F$_8$ gas in flow rates of 150 sccm, 30 sccm, 20 sccm and 80 sccm, respectively, and the gases were excited into plasma. This step is continued for 5 second, for example, to stack the mixture layer 610 of SiC film and CF film having a thickness around 100 Angstroms, for example, on the top surface of the contact layer 500. As a result, a contact layer 600 having a thickness of 400 Angstroms as a whole was formed.

Thereafter, with a radio-frequency power of 2.4 kW, a biasing power of 1.5 kW, a magnetic field in the form of a mirror magnetic field, a process temperature of 400° C. and a process pressure of 0.5 Pa, there were introduced a plasma generating gas such Ar gas, and CF film deposition gases such as C$_4$F$_8$ gas and C$_2$H$_4$ gas in flow rates of 150 sccm, 80 sccm and 20 sccm, respectively, and the gases were excited into plasma. Thus, the CF film 120, 250 Angstrom thick, for example, was formed on the top surface of the mixture layer 610.

Up to this step, the same plasma deposition apparatus is used, and using another plasma deposition apparatus, with a radio-frequency power of 2.4 kW, biasing power of 1.5 kW, a magnetic field in the form of a mirror magnetic field, a process temperature of 400° C. and a process pressure of 0.5 Pa, there were introduced a plasma generating gas such as Ar gas, and CF film deposition gases, such as C$_4$F$_8$ gas and C$_2$H$_4$ gas in flow rates of 150 sccm, 80 sccm and 20 sccm, respectively, and the gases were excited plasma. Thus, the CF film 120 is stacked to a predetermined thickness.

In this semiconductor device, by interposing the mixture layer 610 between the contact layer 500 and the CF film 120, adhesion can be enhanced significantly. Actually, Ti layers and TiN layers were stacked on samples of semiconductor device prepared by the above-described process, and adhesion of the samples was measured. As a result, adhesive force was 9 kpsi, and it was confirmed that separation between SiC films 420 and CF films 120 can be prevented.

The following reason is assumable about such a high adhesion. That is, in the deposition step of the mixture layer 610, the SiC film deposition gases and the CF film deposition gases are introduced simultaneously, so that there grows a mixture layer having Si—C couples and C—F couples and containing Si, C and F altogether. By thus making the mixture layer containing components of the SiC film and components of the CF film, bonds of Si, C and F are more easily produced near the boundary between the SiC film 420 and the mixture layer 610 and the boundary between the mixture layer 610 and the CF film 120. Therefore, adhesion between the contact layer 500 and the CF film 120 is enhanced, and adhesion of the semiconductor device, as a whole, is increased.

Further, in the instant embodiment, the CF film 120 on the mixture layer 610 is deposited in a common plasma deposition apparatus up to a thickness around 250 Angstroms, and its remainder part is deposited in a different plasma deposition apparatus, so that the following advantages are obtained. During the steps of depositing the silicon-rich SiN film 410, SiCN film 510, SiC film 420 and mixture layer 610 of SiC film and CF film, NF$_3$ gas is introduced into the vacuum container 2 after each step, for example, to excite the gas into plasma and clean the interior of the vacuum container 2. On the other hand, in case of deposition of the CF film 120, cleaning is conducted by introducing, typically, O$_2$ gas.

If all films from the silicon-rich SiN film 410 to the CF film 120 are formed in a common plasma deposition apparatus, cleaning by NF$_3$ gas and cleaning by O$_2$ gas will be doubly required, and the need for two kinds of cleaning gases will complicate operations of the apparatus. In contrast, when the CF film is as thin as approximately 250 Angstroms, for example, as proposed in the instant embodiment, NF$_3$ gas is usable in lieu of O$_2$ gas for cleaning. Therefore, throughout the deposition steps from deposition of the contact layer 600 to deposition of the CF film 120, cleaning is possible with NF$_3$ gas alone. That is, the embodiment simplifies operations for cleaning, and it is effective in this respect.

Here again, by using SiO$_2$ films made by various techniques, like a SiO$_2$ film by thermal oxidation, a SiO$_2$ film by a sol-gel method using a parallel-plate-type plasma apparatus, a SiO$_2$ film made in an ICP plasma apparatus, a SiO$_2$ film made in a parallel-plate-type plasma apparatus, a silicon-rich SiN film containing Si atoms in a ratio of 1.5 relative to the number of N atoms, Al, and Cu, for purposes of confirming their adhesion, samples were prepared by stacking contact layers 600 on top surfaces of those SiO$_2$ film, Al, etc. as base layers in the same process as explained above, and further stacking thereon Ti layers, TiN layers and TiF layers, and tests were conducted for confirming adhesion. As a result, in any of the samples, adhesive force was confirmed to be not less than 9 kpsi, and the instant embodiment was confirmed to be effective for improving adhesion between silicon-series insulating films, or metals, and CF films, and reliably prevented separation of films that were otherwise liable to occur between them.

Figure 11:
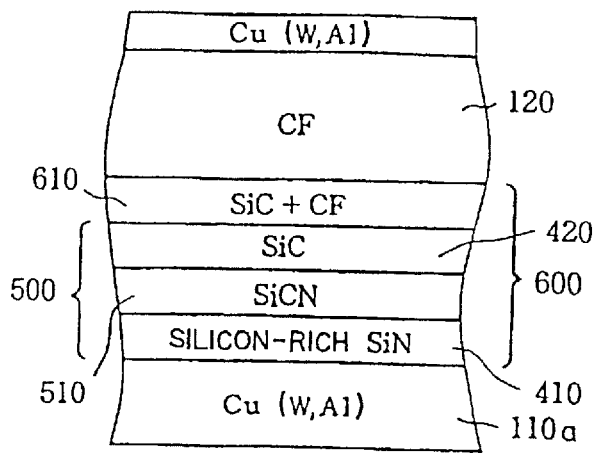
FIG. 11 is a cross-sectional view that shows a yet further embodiment of the semiconductor device according to the invention.

The above-mentioned effects obtainable from the structure shown in FIG. 10 can be obtained, as well, in the structure shown in FIG. 11, which uses a metal film 110a in lieu of the SiO$_2$ film 110.

Figure 12:
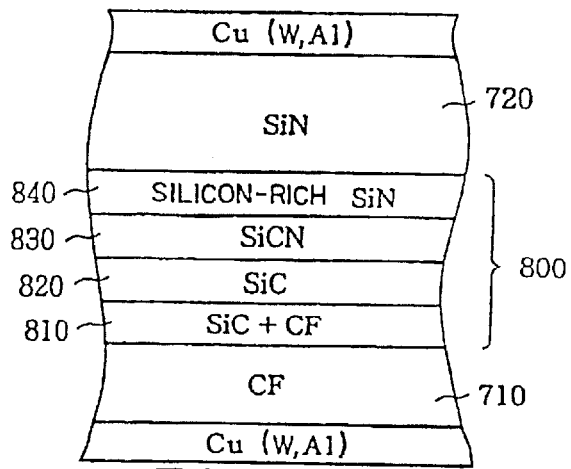
FIG. 12 is a cross-sectional view that shows a yet further embodiment of the semiconductor device.

A yet further embodiment of the invention will be described with reference to FIG. 12. This embodiment is directed to the problem that adhesion between a CF film and a SiN film stacked thereon is weak and liable to cause separation, and hence intends to improve the adhesion. That is, the semiconductor device according to the embodiment shown here is characterized in depositing a mixture layer 810 of SiC film and CF film, a SiC film 820, a SiCN film 830 and a silicon-rich SiN film 840, in this sequence, to form a contact layer 800 altogether between a CF film 710 and a SiN film 720 as shown in FIG. 11.

This semiconductor device may be manufactured as follows. In the above-mentioned plasma deposition apparatus, for example, with a radio-frequency power of 2.4 kW, a biasing power of 1.5 kW, a magnetic field in the form of a mirror magnetic field, a process temperature of 400° C. and a process pressure of 0.5 Pa, there were introduced a plasma generating gas such as Ar gas, CF film deposition gases such as $C_4F_8$ gas and $C_2H_4$ gas in flow rates of 150 sccm, 80 sccm and 20 sccm, respectively, and the gases were excited into plasma. As a result, the CF film 710 is deposited to a thickness of 7000 Angstroms, for example, and the obtained CF film is annealed at 425° C. for 0.5 hours.

After that, with a radio-frequency power of 2.4 kW, a biasing power of 0 kW, a magnetic field in the form of a mirror magnetic field, a process temperature of 400° C. and a process pressure of 0.5 Pa, there were introduced a plasma generating gas such as Ar gas, SiC film deposition gases and CF film deposition gases, such as $SiH_4$ gas, $C_2H_4$ gas and $C_4F_8$ gas in flow rates of 150 sccm, 30 sccm, 20 sccm and 80 sccm, respectively, and the gases were excited into plasma. Thus, the mixture layer 810 of SiC film and CF film, which is approximately 100 Angstrom thick, for example, was formed on the top surface of the CF film 710.

Thereafter, with a radio-frequency power of 2.4 kW, a biasing power of 0 kW, a magnetic field in the form of a mirror magnetic field, a process temperature of 400° C. and a process pressure of 0.1 Pa, there were introduced a plasma generating gas such as Ar gas, and SiC film deposition gases such as $SiH_4$ gas and $C_2H_4$ gas in flow rates of 150 sccm, 30 sccm and 20 scm, respectively, and the gases were ecited into plasma. Thus, the SiC film 820, about 100 Angstrom thick, for example, was formed on the top surface of the mixture layer 810.

Subsequently, with a radio-frequency power of 2.4 kW, a biasing power of 0 kW, a magnetic field in the form of a mirror magnetic field, a process temperature of 360° C. and a process pressure of 0.3 Pa, there were intoduced a plasma generating gas such as Ar gas, and SiCN film deposition gases such as $SiH_4$ gas, $C_2H_4$ gas and $N_2$ gas in flow rates of 200 sccm, 20 sccm, 30 sccm and 5 sccm, respectively, and the gases were excited into plasma. Thus, the SiCN film 620, approximately 100 Angstrom thick, for example, was deposited on the top surface of the SiC film 820.

After that, with a radio-frequency power of 2.4 kW, a biasing power of 0 kW, a magnetic field in the form of a mirror magnetic field, a process temperature of 360° C. and a process pressure of 0.2 Pa, there were introduced a plasma generating gas such as Ar gas, and deposition gases for silicon-rich SiN film, such as $SiH_4$ gas and $N_2$ gas in flow rates of 200 sccm, 20 sccm and 5 sccm, respectively, and the gases were excited into plasma. As a result, the silicon-rich SiN film (containing Si atoms in a ratio of 1.5 relative to the number of N atoms) 840, which is approximately 100 Angstrom thick, for example, was stacked on the top surface of the SiCN film 820. In this way, the contact layer 800 having the total thickness of 400 Angstroms is produced.

After that, with a radio-frequency power of 1.5 kW, biasing power of 0 kW, a magnetic field in the form of a mirror magnetic field, a process temperature of 360° C. and a process pressure of 0.2 Pa, there were instoduced a plasma generating gas such as Ar gas, and SiN film deposition gases such as $SiH_4$ gas and $N_2$ gas in flow rates of 200 sccm, 45 sccm and 75 sccm, respectively, and the gases were excited into plasma. Thus, the SiN film 720 of a predetermined thickness is formed on the top surface of the silicon-rich SiN layer 840.

With semiconductor devices produced in the above-described process (Embodying Example) and semiconductor devices produced by stacking SiN films on CF films (Comparative Example 6), adhesion was actually measured. Comparative Example 6 was prepared by depositing CF films and SiN films under the same deposition conditions as used in the above-described embodiment. As a result, adhesion was 5 kpsi in the Embodying Example, but as low as to disable tape tests in Comparative Example 6. That is, it was confirmed that the instant embodiment could prevent separation between CF films 710 and SiN films 720.

Figure 13:
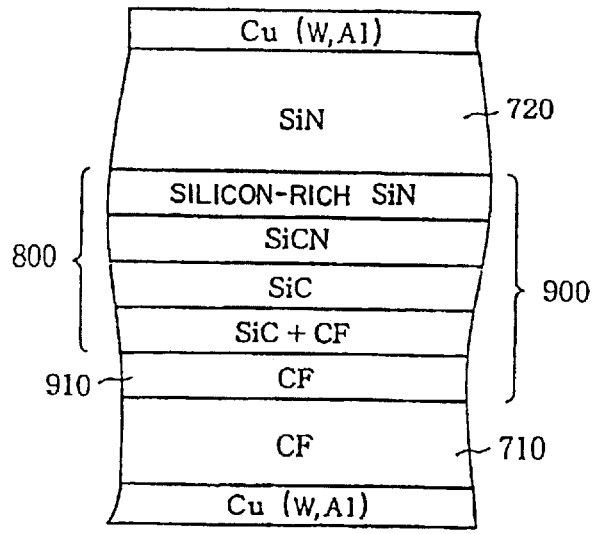
FIG. 13 is a cross-sectional view that shows a yet further embodiment of the semiconductor device according to the invention.

A further embodiment of the invention will be described with reference to FIG. 13. A difference of the semiconductor device shown here from those described above lies in making a CF film 910 between the CF film 710 and the contact layer 800. The CF film 910 is 100 Angstrom thick, for example, and deposited with a radio-frequency power of 2.4 kW, a biasing power of 1.5 kW, a magnetic field in the form of a mirror magnetic field, process temperature of 400° C. and a process pressure of 0.5 Pa by introducing a plasma generating gas such as Ar gas, and CF film deposition gases such as $C_4F_8$ gas and $C_2H_4$ gas in flow rates of 150 sccm, 80 sccm and 20 sccm, respectively, and exciting them into plasma.

Also with this type of semiconductor devices, adhesion was actually measured, and they were confirmed to have the adhesive force of 6.5 kpsi and prevent separation between CF films 710 and SiN films 720.

Enhancement of adhesion between CF films and SiN films like these examples is effective for etching of CF films, for example. That is, for etching a CF film, $O_2$ gas is used as its etching gas. Since normally used resist is ashed by $O_2$ gas, a SiN film not ashed by $O_2$ gas is provided as a hard mask between the CF film and the resist. In this case, adhesion between the CF film and the SiN film is important, and enhancing their adhesion can increase the etching accuracy.

As will be understood, in the instant embodiment, it is useful to produce a contact layer when a SiN film or other silicon-series insulating film is formed on a CF film. As this contact layer, a contact layer as used in semiconductor devices according to the foregoing embodiments may be used. When the contact layer 400 or 500 is used, the contact layer is formed to locate the SiC film 420 nearer to the CF film and the SiN 410 nearer to the silicon-series insulating film. When the contact layer 600 is used, the contact layer is formed to locate the mixture layer 610 of SiC film and CF film nearer to the CF film and the silicon-rich SiN film 410 nearer to the silicon-series insulating film.

In any of the semiconductor devices described above, films may be deposited continuously such as from a $SiO_2$ film, or the like, to the contact layer, from the contact layer to the CF film or among respective films forming the contact layer. In this case, adhesion is further enhanced. Furthermore, in any of the semiconductor devices, upon making a CF film on the top surface of a base film, such as $SiO_2$ film, the contact layer and a part of the CF film may be deposited in a common plasma deposition apparatus while thereafter forming the remainder of the CF film in a different plasma deposition apparatus. In this case, cleaning process is simplified.

In the description made above, usable as CF film deposition gases are compound gases of C and F, such as $CF_4$ gas, $C_2F_6$ gas, $C_3F_8$ gas, $C_5F_8$ gas and $C_6F_6$ gas, for example, gases containing C, F and H, not limited to only C and F, such as $CHF_3$ gas, and hydrocarbon gases such as $CH_4$ gas, $C_2H_2$ gas, $C_2H_6$ gas and $C_3H_8$ gas, for example. Also, hydrogen gas may be used instead of hydrocarbon gas. A combination of $SiH_2Cl_2$ gas and $NH_3$ gas or a combination of $SiH_4$ gas and $NH_3$ gas is usable as SiN film deposition gases.

Furthermore, in the present invention, ECR is not indispensable for generating plasma. Instead, plasma may be generated by the method, called ICP (inductive coupled plasma), which applies an electric field and a magnetic field to process gases from a coil wound around a dome-shaped container. Also usable are a method which generates plasma, called helicon wave plasma, by interaction between a helicon wave of 13.56 MHz, for example, and a magnetic field applied from a magnetic coil, a method which generates plasma, called magnetron plasma, by applying a magnetic field substantially in parallel with two parallel cathodes, and a method which generates plasma by applying a radio-frequency power between opposed parallel electrodes, called parallel plates.

As described above, according to the invention, adhesion between a silicon-containing insulating film, or metal, and a fluorine-containing carbon film can be increased, by providing a contact layer, having any of various forms, between the fluorine-containing carbon layer and the silicon-containing insulating film or the metal wiring layer in a semiconductor device using the fluorine-containing carbon film as its insulating film.

What is claimed is:

1. A semiconductor device having a plurality of wiring layers made of a conductive material and an electrically insulating layer interposed between the wiring layers, comprising:
    a first insulating layer adjacent to at least one of said wiring layers and made of a fluorine-containing carbon film;
    a second layer located on one side of said first insulating layer opposite from said at least one of said wiring layers and including a compound layer containing silicon; and
    a contact layer made of a compound containing silicon and interposed between said first insulating layer and said second layer to prevent separation of said first insulating layer and said second layer, said contact layer containing silicon and nitrogen.

2. A semiconductor device having a plurality of wiring layers made of a conductive material and an electrically insulating layer interposed between the wiring layers, comprising:
    a first insulating layer adjacent to at least one of said wiring layers and made of a fluorine-containing carbon film;
    a second layer located on one side of said first insulating layer opposite from said at least one of said wiring layers and including a compound layer containing silicon; and
    a contact layer made of a compound containing silicon and interposed between said first insulating layer and said second layer to prevent separation of said first insulating layer and said second layer, said contact layer containing silicon including a first compound layer containing silicon and carbon, and a second compound layer containing silicon and nitrogen, said first compound layer being located nearer to said first insulating layer and said second compound layer being located nearer to said second layer.

3. The semiconductor device according to claim 2, further comprising a third compound layer located between said first compound layer and said second compound layer and containing silicon, carbon and nitrogen.

4. The semiconductor device according to claim 3, further comprising a fourth compound layer located between said first compound layer and said first insulating layer and containing silicon, carbon and fluorine.

5. The semiconductor device according to claim 4, further comprising a fifth compound layer located between said fourth compound layer and said first insulating layer and containing carbon and fluorine.

6. The semiconductor device according to claim 1 wherein said film containing silicon and nitrogen is a silicon-rich silicon nitride film.

7. The semiconductor device according to claim 1, wherein said second layer is an insulating layer containing silicon nitride.

8. The semiconductor device according to claim 2, wherein said second layer is an insulating layer containing silicon nitride.

* * * * *